(12) United States Patent
Ishida et al.

(10) Patent No.: US 12,311,504 B2
(45) Date of Patent: May 27, 2025

(54) HOLDING MECHANISM AND EXPOSURE APPARATUS

(71) Applicant: Ushio Denki Kabushiki Kaisha, Tokyo (JP)

(72) Inventors: Kenji Ishida, Tokyo (JP); Takeshi Kitamura, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 215 days.

(21) Appl. No.: 18/218,722

(22) Filed: Jul. 6, 2023

(65) Prior Publication Data
US 2024/0033881 A1      Feb. 1, 2024

(30) Foreign Application Priority Data

Jul. 26, 2022   (JP) .................. 2022-118345

(51) Int. Cl.
*B25B 11/00* (2006.01)
*G03F 7/00* (2006.01)

(52) U.S. Cl.
CPC ........ *B25B 11/005* (2013.01); *G03F 7/70708* (2013.01)

(58) Field of Classification Search
CPC .... G03F 7/70708; G03F 7/707; G03F 7/7095; G03F 7/70341; B25B 11/005
See application file for complete search history.

(56) References Cited

U.S. PATENT DOCUMENTS

| | | | |
|---|---|---|---|
| 2016/0154313 A1* | 6/2016 | Funabashi | H01L 21/6838 430/323 |
| 2018/0193983 A1* | 7/2018 | Ishino | H01L 21/6838 |
| 2023/0253234 A1* | 8/2023 | Sugisaki | G03F 7/70916 355/73 |

FOREIGN PATENT DOCUMENTS

JP      2002-217276 A      8/2002

* cited by examiner

*Primary Examiner* — Peter B Kim
(74) *Attorney, Agent, or Firm* — Yoshida & Associates LLC; Kenichiro Yoshida

(57) ABSTRACT

A holding mechanism includes a suction section and a sealing section. The suction section includes a suction area where a substrate is subjected to vacuum suction. The sealing section includes an elastic section having a plurality of sides arranged to surround the suction area and a plurality of corners each formed between adjacent ones of the plurality of sides, and a repulsive-force-suppressing section provided in at least one of the plurality of corners.

12 Claims, 11 Drawing Sheets

HOLDING MECHANISM AND EXPOSURE APPARATUS

CROSS-REFERENCE TO RELATED APPLICATION(S)

This application claims priority from Japanese Priority Patent Application No. 2022-118345 filed on Jul. 26, 2022. The entire teachings of the above application are incorporated herein by reference.

BACKGROUND ART

The present invention relates to a holding mechanism for holding a substrate and an exposure apparatus including the holding mechanism.

In the process of manufacturing printed circuit boards, semiconductor substrates, liquid crystal substrates, etc., work stages are used to suction and hold substrates to prevent the substrates from being displaced in position during exposure and other processing processes. Vacuum suction is widely used as a method of holding substrates.

For example, Japanese Unexamined Patent Application Publication No. 2002-217276 discloses a stage device that holds a substrate by vacuum suction. In this stage device, a substrate is subjected to vacuum suction with a thin plate member having multiple through-holes connected to a vacuum system. An elastic member for sealing is annularly provided around the thin plate member. This suppresses vacuum leakage caused by the warping of the substrate, for example. (see paragraphs [0015], [0024], [0025], FIG. 1, FIG. 5, etc. of the specification in Japanese Unexamined Patent Application Publication No. 2002-217276)

SUMMARY OF THE INVENTION

In recent years, the flatness of substrates required during exposure has become a high level with advancing the miniaturization of wiring and increasing mounting density. On the other hand, it becomes increasingly difficult to improve flatness as substrates become larger. Hence, there is a need for technology for achieving vacuum suction with a high degree of flatness.

In view of the above circumstances, it is an object of the present invention to provide a holding mechanism and an exposure apparatus capable of achieving vacuum suction with a high degree of flatness.

In order to achieve the above-mentioned object, a holding mechanism according to an aspect of the present invention includes a suction section and a sealing section. The suction section includes a suction area where a substrate is subjected to vacuum suction. The sealing section includes an elastic section having a plurality of sides disposed to surround the suction area and a plurality of corners each formed between adjacent ones of the plurality of sides, and a repulsive-force-suppressing section provided in at least one of the plurality of corners.

The holding mechanism is provided with the sealing section including the elastic section disposed to enclose the suction area where the substrate is subjected to vacuum suction. The repulsive-force-suppressing section is provided in the corners constituting the sealing section. This makes it possible to reduce the repulsive force in the corners, resulting in suppressing the substrate from bulging. As a result, vacuum suction with high flatness can be achieved.

The elastic section may have a mounting face on which the substrate is to be placed. In this case, the repulsive-force-suppressing section may have a structure in which an area of the mounting face in the corner is smaller than an area of an intersection area where two sides connecting to the corner are extended and intersected.

The repulsive-force-suppressing section may include a cutout formed inside the corner.

The cutout may have a planar shape of either a square or a circle.

The repulsive-force-suppressing section may include a step section in which at least a part of a front face of the corner is lowered with respect to the mounting face.

The repulsive-force-suppressing section may be disposed in the corner and include a low-repulsion section made of an elastic material having a lower repulsive force than the sides.

The repulsive-force-suppressing section may be disposed to overlap the intersection area where the two sides connecting to the corner are extended and intersected. Or, the repulsive-force-suppressing section may be disposed to be in contact with the intersection area.

The elastic section may have a planar shape of a rectangle. In this case, the plurality of corners may include four corners corresponding to four vertices of the rectangular shape. In addition, the repulsive-force-suppressing section may be provided in at least one of the four corners.

The suction section may include a base having a recess from which vacuum is supplied and a plurality of protrusions formed in the recess, and a suction plate having a suction face forming the suction area and a plurality of through-holes formed in the suction face, and the suction plate being mounted on the recess. In this case, the sealing section may be attached to either the base or the suction section.

The suction section may include a mounting section disposed at a lower position than the suction face and to which a lower face of the sealing section is attached. In this case, the sealing section may be configured such that the upper face thereof that is opposite to the lower face protrudes higher than the suction face in a state in which the mounting section is attached to the lower face.

The elastic section may be configured using a rubber sponge.

An exposure apparatus according to an aspect of the present invention includes a light emission section, a mask stage, and a work stage. The light emission section emits exposure light. The mask stage holds a mask on which a pattern has been formed in an optical path of the exposure light. The work stage holds a workpiece to which the pattern is to be transferred. The work stage includes a suction section having a suction area where the workpiece is subjected to vacuum suction, a sealing section including an elastic section having a plurality of sides arranged to surround the suction area and a plurality of corners each formed between adjacent ones of the plurality of sides, and a repulsive-force-suppressing section provided in at least one of the plurality of corners.

As described above, the present invention is capable of achieving vacuum suction with high flatness. The effects described herein are not necessarily limiting; however, they may be any of the effects described in this disclosure.

Hereinafter, embodiments according to the invention will be described with reference to the drawings.

Configuration of Exposure Apparatus

Figure 1:
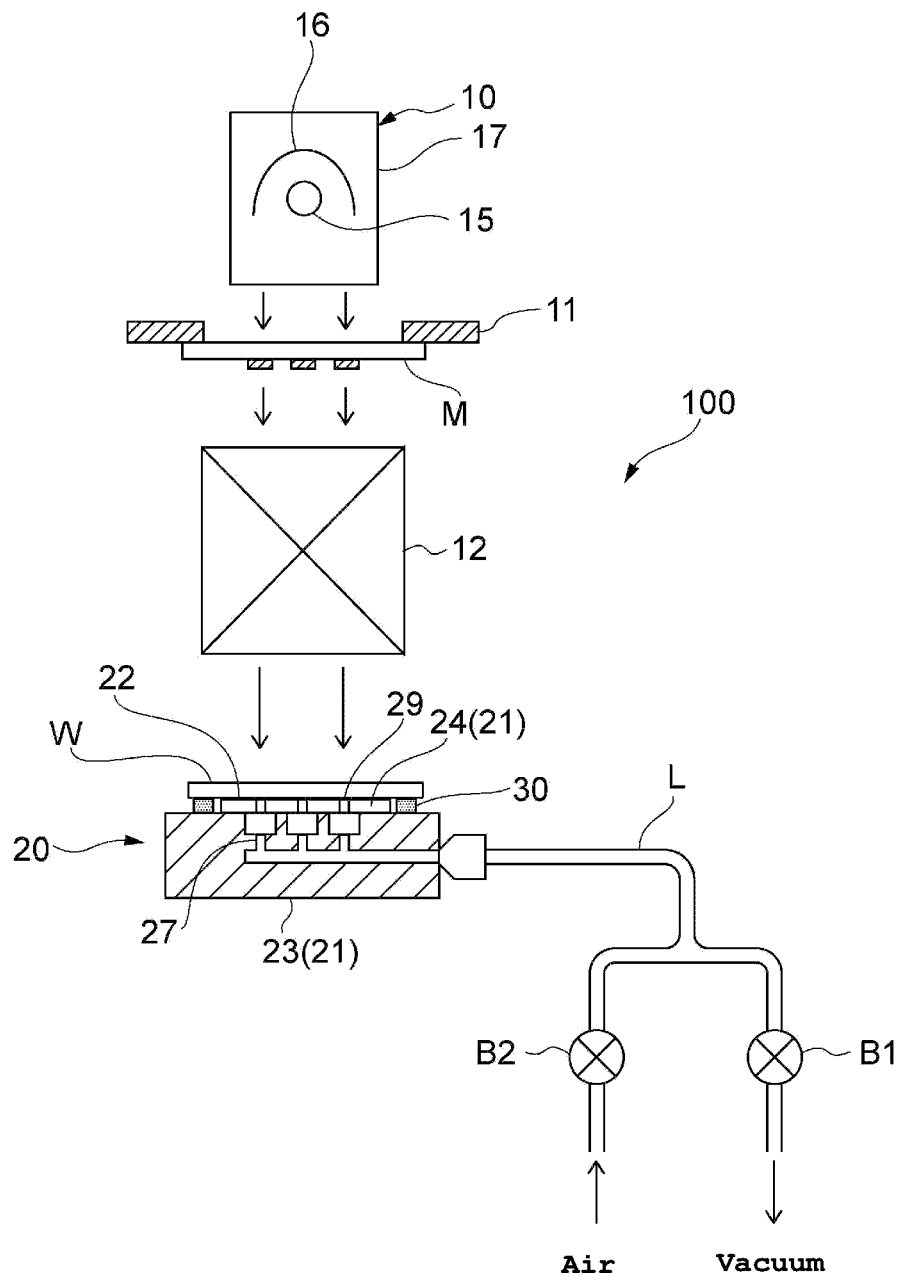
FIG. 1 is a schematic view illustrating a configuration example of an exposure apparatus including a work stage according to a first embodiment of the present invention.

FIG. 1 is a schematic view illustrating a configuration example of an exposure apparatus including a work stage according to a first embodiment of the present invention. An exposure apparatus 100 is an exposure apparatus that exposes a workpiece W. Here, the workpiece W can be a printed circuit board, for example. In the present embodiment, the workpiece W corresponds to a substrate held by a holding mechanism. The exposure apparatus 100 includes a light irradiation section 10, a mask M, a mask stage 11, a projection lens 12, a work stage 20, and piping L.

The light irradiation section 10 emits exposure light. The light irradiation section 10 includes a lamp 15, a mirror 16, and a lamp house 17. The lamp 15 is an exposure light source that emits exposure light including ultraviolet light. The mirror 16 reflects the exposure light emitted from the lamp 15 in a predetermined output direction. The lamp house 17 is an enclosure that houses the lamp 15 and the mirror 16. Here described is the case in which the light source of the light irradiation section 10 is the lamp 15; however, the light source may include an LED (light-emitting diode) and laser light source. In addition, the wavelength and bandwidth of the exposure light are also not limiting. In the present embodiment, the light irradiation section 10 corresponds to the light emission section that emits the exposure light.

The mask M is formed with a pattern such as a circuit pattern to be exposed (transferred) to the workpiece W. The mask stage 11 holds the mask formed with the pattern in an optical path of the exposure light. The projection lens 12 projects the exposure light that has transmitted through the mask M onto the workpiece W. For example, the projection lens 12 is configured as a reduction optical system in which the pattern of the mask M is reduced to form an image on the front surface of the workpiece W. The present embodiment describes a case in which the exposure apparatus 100 includes the projection lens 12; however, the present invention can also be applied to an exposure apparatus without the projection lens 12.

The work stage 20 holds the workpiece W onto which the pattern of the mask M is transferred. Specifically, the work stage 20 includes a holding mechanism that holds the workpiece W (substrate) with vacuum suction. The work stage 20 includes a suction area 22 provided with a plurality of vacuum suction holes 29 and a sealing section 30 disposed to surround the suction area 22. The vacuum suction holes 29 are connected to the piping L for drawing vacuum. The specific configurations of the work stage 20 will be described in detail later.

For drawing vacuum, the piping L is connected to the work stage 20 at one end thereof and is provided a branch path divided into two ports at the other end thereof. The branch path is connected to a vacuum pump (not shown in the figure) via a valve B1 at one port thereof and is connected to an air inlet (not shown in the figure) via a valve B2 at the other port thereof. As the valves B1 and B2, solenoid valves or the like are used to shut off the flow paths.

Basic Operation of the Exposure Apparatus

The following will describe a flow of the basic operation of the exposure apparatus 100. In the exposure apparatus 100, the workpiece W, such as a printed circuit board, is transported by a transport means (not shown). The workpiece W is placed on the work stage 20 with its front surface (the surface on which the pattern is formed) facing an upper side. More precisely, the workpiece W is placed on the sealing section 30 surrounding the suction area 22. At this time, the front surface of the workpiece W is coated with resist sensitive to the exposure light.

After the workpiece W is placed, the valve B2 of the piping L is closed and the valve B1 is opened. As a result, vacuum is supplied to the through-hole (vacuum suction holes 29) connected to the piping L, and the workpiece W is suctioned to the suction area 22. Then, the sealing section 30 is elastically deformed in a manner that it is squashed by the vacuum suction of the workpiece W. This prevents the vacuum from leaking between the back surface of the workpiece W and the work stage 20, thereby securely holding the workpiece W by vacuum suction.

The exposure light emitted from the light irradiation section 10 is radiated onto the workpiece W held with the work stage 20 through the mask M and the projection lens 12. The pattern that has been formed on the mask M is then projected onto the workpiece W to expose the desired pattern. The vacuum is continuously supplied to the work stage 20 such that the workpiece W does not move during exposure process.

Upon the completion of the exposure process, the valve B1 is closed and the vacuum supplied to the vacuum suction holes 29 is stopped. This releases the vacuum suction of the workpiece W. The valve B2 is then opened to supply air to the vacuum suction holes 29. As a result, air is blown through the vacuum suction holes 29, removing the workpiece W from the work stage 20. The workpiece W is then collected by a transport means (not shown) and transported to the outside of the exposure apparatus 100.

Configuration of the Work Stage

Figure 2A:
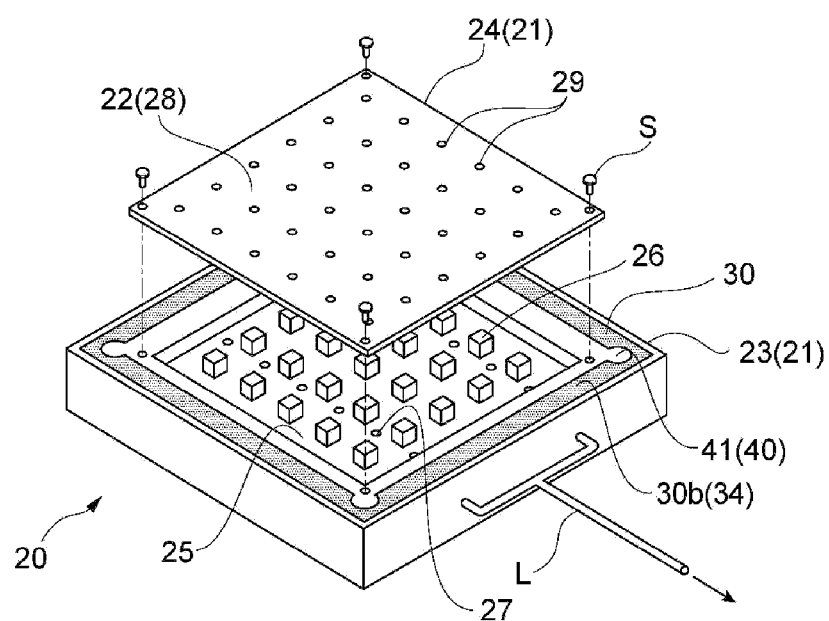
FIG. 2A is a perspective view schematically illustrating a configuration example of a work stage.
Figure 2B:
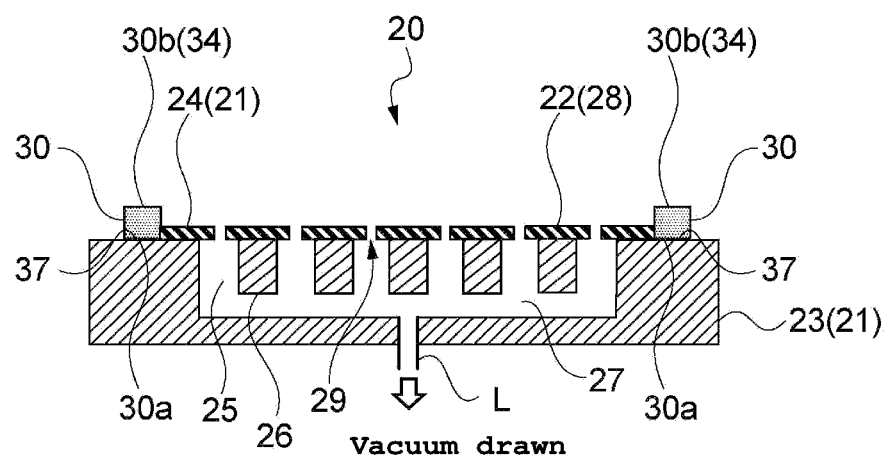
FIG. 2B is a cross-sectional view schematically illustrating a configuration example of the work stage.

FIGS. 2A and 2B are schematic views of a configuration example of the work stage 20. FIG. 2A is a perspective view illustrating a state in which the work stage 20 is disassembled. FIG. 2B is a cross-sectional view schematically illustrating a configuration example of the work stage 20. As shown in FIGS. 2A and 2B, the work stage 20 includes a suction section 21 and the sealing section 30. In the following, the side of the work stage 20 on which the workpiece W is held (the side to which the exposure light is radiated) is described as the upper side of the work stage, and the opposite side is described as the lower side.

The suction section 21 has the suction area 22 in which the workpiece W is subjected to vacuum suction. The suction area 22 is a flat area where the workpiece W is held by vacuum suction and is located on the upper side of the work stage 20. During vacuum suction, the workpiece W is held in such a way that it sticks to the suction area 22. The suction section 21 includes a base 23 and a suction plate 24 attached to the base 23. The suction area 22 is formed on the front surface of the suction plate 24. The suction section 21 also includes a mounting section 37 for mounting the sealing section 30.

The base 23 is a metal block that serves as a foundation of the suction section 21. The base 23 has a planar shape of a rectangle (here, substantially a square) when viewed from the upper side. The base 23 is typically configured to be an aluminum block with an electroless nickel plate on its surface; however, an aluminum block with anodized treatment or sprayed ceramics on its surface may also be used. The base 23 may also be made of a metal such as iron or copper.

A recess 25 is formed in the center portion of the upper side surface of the base 23, and a plurality of protrusions 26 on which the suction plate 24 is placed are formed in the recess 25. The recess 25 is also provided with a plurality of vacuum introduction channels 27 through which vacuum is introduced from the vacuum system (piping L) attached to the base 23 into the recess 25. The vacuum or air supplied to the piping L is introduced to the recess 25 through the vacuum introduction channels 27. Accordingly, the base 23 includes a recess 25 to which the vacuum is supplied and the plurality of protrusion 26 formed in the recess 25.

The upper side surface of the base 23 is finished to a precision flat surface. Here, the upper side surface is a face formed with the upper face of the protrusion 26 and the outer-periphery face of the upper side of the base 23 (the surface surrounding the edge of the recess 25). That is, the upper face of the protrusion 26 and the outer-periphery face of the base 23 are at the same height, and their flatness is about 10 μm. The upper side surface of the base 23 is a face on which the suction plate 24 is mounted.

The suction plate 24 is a thin plate member that is sized to completely cover the recess 25 of the base 23 and is made of a material having some flexibility to conform to the upper side surface of the base 23. For example, a stainless steel plate having a thickness of 0.3 mm is used as the suction plate 24. The thickness and material of the suction plate 24 are not limited to this, and the thickness and material of the suction plate 24 may be selected according to the size of the recess 25, for example. As shown in FIG. 2, suction plate 24 has a suction face 28 and the plurality of vacuum suction holes 29.

The suction face 28 is a face that forms the suction area 22. In other words, the suction face 28 is a face on which the workpiece W is held during vacuum suction. The suction plate 24 is mounted above the recess 25 of the base 23 with the suction face 28 on the upper side. In the example shown in FIG. 2A, through-holes are provided at the four corners of the suction plate 24 for inserting screws S, and the suction plate 24 is fixed to the base 23 by the screws S. Other fixtures other than the screws S may be used to fix the plate.

The plurality of vacuum suction holes 29 are throughholes formed in the suction face 28. The vacuum suction holes 29 are provided over the entire area overlapping the recess 25 of the base 23 when viewed from the upper side. Here, the vacuum suction holes 29 having a predetermined diameter are provided in a grid pattern at regular intervals. The positions of the vacuum suction holes 29 positions are set so as not to coincide with the position of the protrusion 26 of the base 23. When the suction plate 24 is mounted on the base 23 and vacuum is supplied to the base 23, the vacuum is introduced to the recess 25 of the base 23 as described above, and the vacuum is also supplied to the vacuum suction holes 29 of the suction plate 24 covering the recess 25. This enables the workpiece W to be subjected to vacuum suction.

In the exposure apparatus 100, the plurality of suction plates 24 are prepared corresponding to the size and shape of the workpiece W or the position of a cutout or a through-hole provided in the workpiece W. The number, hole diameter, shape, and arrangement of the vacuum suction holes 29 on each of the suction plates 24, and the area where the vacuum suction holes 29 are provided are set depending on the workpiece W.

For example, in the example shown in FIGS. 2A and 2B, circular holes are provided as the vacuum suction holes 29, however, this is not limiting; through-holes of various shapes, such as rectangular holes and flat oval holes, can be provided as the vacuum suction holes 29. In the example shown in FIG. 2, the vacuum suction holes 29 are provided over the entire area corresponding to the recess 25 of the suction plate 24 at regular intervals; however, this is not limiting; the vacuum suction holes 29 may be provided only in a certain predetermined area depending on the size of the workpiece W. In addition, the size (diameter, etc.) and arrangement of the vacuum suction holes 29 can also be desirably set in the face of one suction plate 24 depending on the size, softness, warpage, etc. of the workpiece W.

Configuring the suction plate 24 in this way makes it possible to select the most suitable suction plate 24 depending on the type of workpiece W to be processed and to suck and hold the workpiece W.

The sealing section 30 is an annular elastic member disposed to surround the suction area 22. The sealing section 30 has a lower face 30a and an upper face 30b. The lower face 30a is a face on which the sealing section 30 is attached to the base 23. The upper face 30b is a face opposite to the lower face 30a. At least a part of the upper face 30b serves as a mounting face 34 that will be described below.

In the present embodiment, the sealing section 30 is attached to the base 23. Specifically, the sealing section 30 is attached so as to surround the suction plate 24 with its lower face 30a being in contact with the upper side surface of the base 23. In other words, the annular area surrounding the suction plate 24 on the upper side surface of the base 23 is the mounting section 37 to which the lower face 30a of the sealing section 30 is attached. As shown in FIG. 2B, the mounting section 37 is in a lower position than the suction face 28 because of the thickness of the suction plate 24. In this way, the lower face 30a of the sealing section 30 is attached to the mounting section 37 that is provided at a lower position than the suction face 28.

The sealing section 30 is configured such that the upper face 30b protrudes higher than the suction area 22 (suction face 28) in a state in which the lower face 30a is attached to the mounting section 37. Hence, when the workpiece W is placed on the work stage 20, the workpiece W is held in contact with the upper face 30b of the sealing section 30 and separated from the suction face 28 when no vacuum suction is performed (see FIG. 5A). When the workpiece W is subjected to vacuum suction, the sealing section 30 is deformed and compressed by the workpiece W, which is attracted to the suction face 28, thereby functioning as a leak-suppression mechanism that suppresses vacuum leakage (see FIG. 5B).

The shape of the sealing section 30 is configured in a manner that the area where the sealing section 30 is in contact with the workpiece W is a closed annular area. Typically, the shape of the outer periphery of the sealing section 30 is set to be similar shape and size as the outer periphery of the workpiece W. Note that the shape of the sealing section 30 may be set appropriately to the extent that it enables the workpiece W to be properly subjected to vacuum suction. For example, the sealing section 30 may be configured such that the outer periphery of the sealing section 30 fits inside the outer periphery of the workpiece W. The sealing section 30 may also be configured such that the outer periphery of the workpiece W fits between the inner periphery and the outer periphery of the sealing section 30.

In the present configuration in which the sealing section 30 is attached to the base 23, the position of the suction face 28 is higher than the face on which the sealing section 30 is attached (upper side surface of the base 23). Hence, during vacuum suction, the workpiece W is sucked and held on the suction face 28 at the time when the thickness of the sealing section 30 is compressed to the thickness of the suction plate 24. In other words, the sealing section 30 becomes substantially flush with the suction plate 24 at the time of compression. Hence, there is no need to provide an additional step or the like on the upper side surface of the base 23 in order to make the sealing section 30 substantially flush with the suction plate 24 during compression. This simplifies the configuration of the base 23, reducing manufacturing costs.

Moreover, since the suction plate 24 need not be provided with an additional step or the like, it is possible to manufacture various suction plates 24 in accordance with the workpiece W at low cost.

Configuration of Sealing Section

Figure 3:
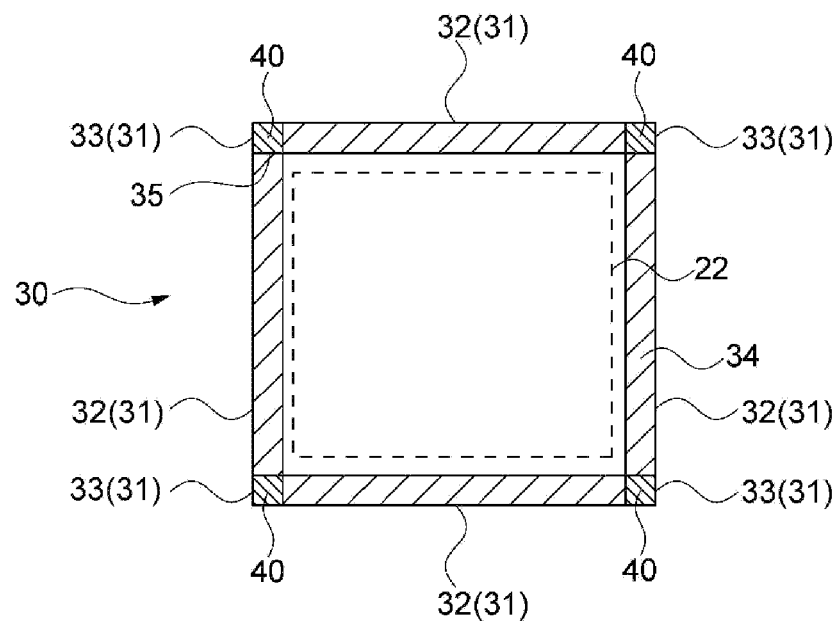
FIG. 3 is a schematic view describing a basic configuration of a sealing section.

FIG. 3 is a schematic view describing a basic configuration of the sealing section 30. FIG. 3 is a plan view schematically illustrating a basic configuration of the sealing section 30. Here, each part of the sealing section 30 will be described with reference to FIG. 3. The sealing section 30 includes an elastic section 31 and a repulsive-force-suppressing section 40.

The elastic section 31 is the body of the sealing section 30, which is configured using an elastic material. The elastic section 31 is configured using a rubber sponge, for example. The material constituting the elastic section 31 includes a low-repulsion elastic material such as ethylene propylene diene rubber (EPDM), fluorine rubber, and urethane. The elastic section 31 may be constituted entirely by a similar material or, as described with reference to FIG. 9, may be partially constituted by different materials. The planar shape of the elastic section 31 is a strip area surrounding the suction area 22. In FIG. 3, a rectangle-shaped strip area is provided as the elastic section 31. Hence, the planar shape of the elastic section 31 is a rectangular shape. In FIG. 3, the suction area 22 (in this case, the area where the suction plate 24 is disposed) is schematically illustrated with a dotted-line area. The elastic section 31 has a plurality of sides 32, a plurality of corners 33, and the mounting face 34.

The plurality of sides 32 is arranged around the suction area 22. Each of the sides 32 is, for example, an elongated rectangle-shaped area (a straight-line area with a certain width) extending in one direction and forms a side in the rectangle-shaped elastic section 31. In the example shown in FIG. 3, the four straight-line sides 32 with a certain width are arranged to surround the upper side, right side, lower side, and left side of the rectangle-shaped suction area 22.

The plurality of corners 33 is formed between the adjacent sides 32 of the plurality of sides 32. Each of the corners 33 is, for example, a portion connecting the two sides 32 adjacent to each other. When the two sides 32 are regarded as straight lines, the corner 33 corresponds to a vertex formed between the two straight lines. In the example shown in FIG. 3, the four corners 33 are disposed on the upper right side, upper left side, lower left side, and lower right side of the suction area 22, corresponding to the four sides 32 arranged in a rectangular shape. In other words, the plurality of corners includes the four corners 33 corresponding to the four vertices of the rectangular shape.

In the following, when the adjacent sides 32 are extended and intersect, the area where the two sides 32 intersect is described as an intersection area 35. For example, as shown in FIG. 3, when the adjacent sides 32 are arranged to be orthogonal and the width of each side 32 is equal, the intersection area 35 is a square-shaped area where one side thereof is equal to the width of the side 32. It can also be said that the corners 33 described above are formed in the intersection area 35 in the elastic section 31 constituted by the plurality of the sides 32.

The mounting face 34 is a surface on which the workpiece W is placed in the elastic section 31. Here, in the respective sides 32 and the corners 33, the surface with which the workpiece W is in contact in the state in which no vacuum suction is performed becomes the mounting face 34. In other words, it can be said that the mounting face 34 is a surface that supports the workpiece W in a natural state in which the elastic section 31 (sealing section 30) is uncompressed. For example, the thicknesses of the plurality of sides 32 and the plurality of corners 33 are set constant. In this case, all the upper side surfaces of the elastic section 31 become the mounting face 34. When a part of the plurality of sides 32 and the plurality of corners 33 are configured to be low (see FIGS. 8A to 8D, etc.), the upper side surface of the elastic section 31, excluding the part, becomes the mounting face 34.

The repulsive-force-suppressing section 40 is a structural portion that suppresses a repulsive force generated when the elastic section 31 is compressed. When the elastic section 31, which is made of an elastic material, is compressed and deformed, it exerts a repulsive force on the member (workpiece W) that compresses the elastic section 31 in an attempt to return it to its original shape. Typically, when the amount of compression (amount of collapse) of the elastic section 31 is larger, the repulsive force from the elastic section 31 is larger. Such a repulsive force is smaller in the portion where the repulsive-force-suppressing section 40 is provided than in the case where no repulsive-force-suppressing section 40 is provided.

In the sealing section 30, the repulsive-force-suppressing section 40 is provided for at least one of the plurality of corners 33. The repulsive force of the elastic section 31 becomes smaller in the corners 33 where the repulsive-force-suppressing section 40 is provided. In the present embodiment, the repulsive-force-suppressing sections 40 are provided at all of the plurality of corners 33. In the example shown in FIG. 3, the repulsive-force-suppressing sections 40 are provided at the respective four corners 33. This makes it possible to reduce the repulsive force at the four corners of the rectangle-shaped elastic section 31. The configuration of the repulsive-force-suppressing section 40 will be specifically described below.

Figure 4:
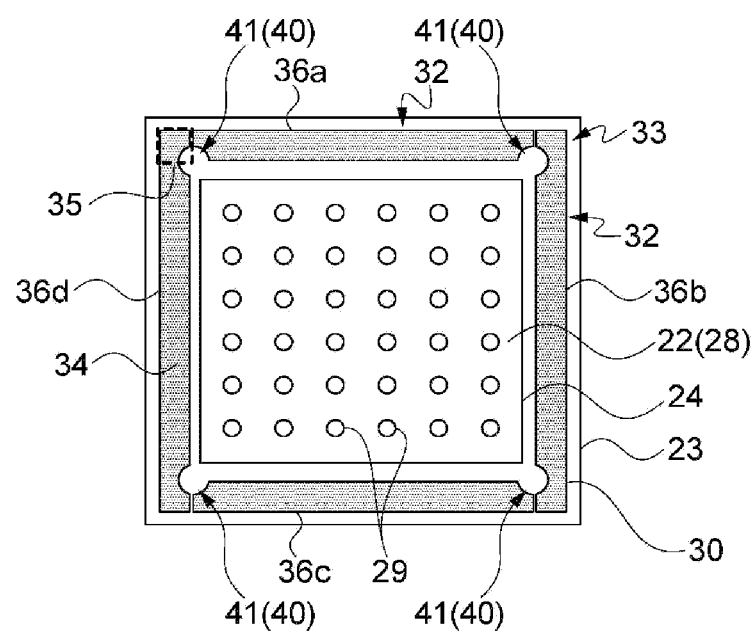
FIG. 4 is a schematic view illustrating a planar configuration example of the sealing section provided on the work stage.

FIG. 4 is a schematic view illustrating a planar configuration example of the sealing section 30 provided on the work stage 20. FIG. 4 illustrates a plan view of the work stage 20 shown in FIGS. 2A and 2B from the upper side. In the following, it is assumed that the thicknesses of the sides 32 and the corners 33 constituting the sealing section 30 (elastic section 31) are all set constant.

Here, the repulsive-force-suppressing section 40 adopts a structure in which the area in which the repulsive force acts is reduced. Specifically, in the repulsive-force-suppressing section 40, the area of the mounting face 34 in the corner 33 is made smaller than the area of the intersection area 35 where the two sides 32 connecting to the corner 33 are extended and intersect. This means that the area in which the uncompressed corner 33 is in contact with the workpiece W is smaller than the intersection area 35. This makes it possible to suppress the repulsive force acting on the workpiece W in the corner 33.

As shown in FIG. 4, here, a cutout 41 formed inside the corner 33 is provided as the repulsive-force-suppressing section 40. In other words, the circular cutout 41 is formed in the corner 33, with the inner circumference formed by the side 32 cut outward. The cutouts 41 are provided for all of the corners 33. In other words, the rectangle-shaped sealing section 30 (elastic section 31) is provided with the four cutouts 41 corresponding to the respective four corners.

Here, the intersection area 35 is focused on. FIG. 4 illustrates the intersection area 35 of the two sides 32 connecting to the corner 33, the intersection area 35 being superimposed on the upper left corner 33 of the sealing section 30. Providing the cutout 41 allows the area of the mounting face 34 formed in the corner 33 to be smaller than the intersection area 35. This makes it possible to reduce the repulsive force generated in the corner 33 compared to a configuration in which the entire intersection area 35 becomes the mounting face 34 in the corner 33 constituting a similar material as the sides 32 (see FIG. 10), for example. In FIG. 4, it is noted that the cutout 41 cuts not only the corner 33 but also the portions of the sides 32 connecting to the corner 33 (the end portions of the sides 32). This makes it possible to sufficiently avoid the bulge in the corner 33, which will be described below.

In the example shown in FIG. 4, the sealing section 30 is formed by bonding four members 36a, 36b, 36c, and 36d together. Of these, the members 36a and 36c, which are located on the upper side and the lower side in the figure respectively, are sandwiched between the members 36b and 36d, which are located on the right side and the left side in the figure respectively. Both of the members 36a and 36c constitute the sides 32. Meanwhile, both ends of the members 36b and 36d constitute the corners 33, because the members 36a and 36c are disposed adjacent to the members 36b and 36d. In this way, even when the sealing section 30 is constituted by the multiple members 36, the repulsive-force-suppressing section 40 (in this case, cutout 41) is provided in the portion that becomes a corner 33 in a planar shape. A certain gap may be formed between the four members 36a, 36b, 36c, and 36d; however, such a gap is filled when the members are compressed and deformed, thereby posing no concern that vacuum leakage occurs. The sealing section 30 (elastic section 31) is not limited to the case in which the sealing section 30 (elastic section 31) is divided into the plurality of members 36; however, the sealing section 30 may be formed integrally as one connected member, for example.

Vacuum Suction with Sealing Section

Figure 5A:
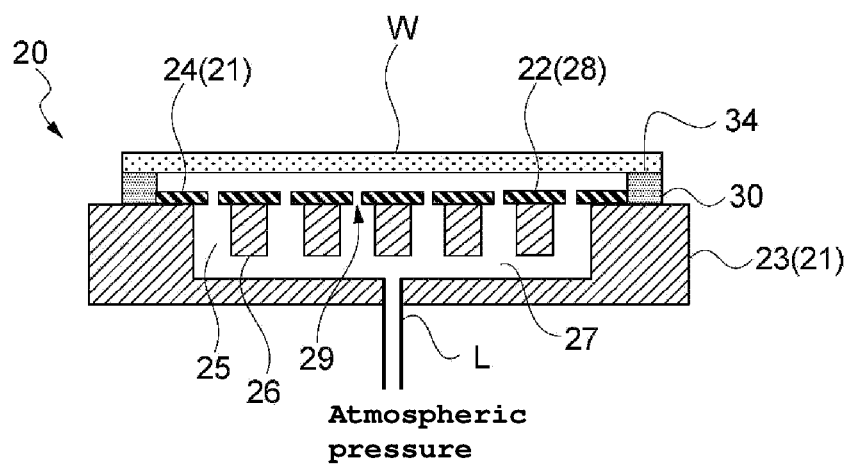
FIG. 5A is a schematic view illustrating an operation of vacuum suction by the work stage.
Figure 5B:
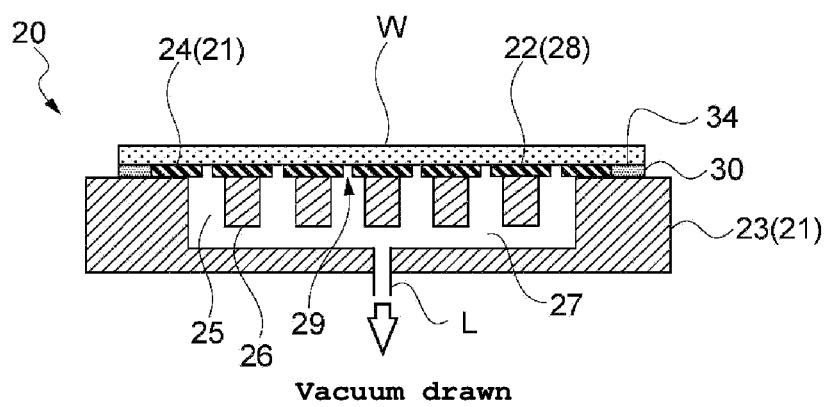
FIG. 5B is a schematic view illustrating an operation of vacuum suction by the work stage.

FIG. 5 is a schematic view illustrating the operation of vacuum suction by the work stage 20. FIGS. 5A and 5B are cross-sectional views of the work stage 20 illustrating the state in which vacuum suction is not yet performed and the state in which vacuum suction is performed, respectively. As shown in FIG. 5A, when the workpiece W is placed on the work stage 20, the recess 25 of the base 23 is at atmospheric pressure, hence the sides 32 and corners 33 of the sealing section 30 (elastic section 31) are barely deformed and in a natural state. In this case, the workpiece W is supported on the mounting face 34 of the sealing section 30 in a state in which the workpiece W floats off the suction face 28 (suction plate 24).

As shown in FIG. 5B, when vacuum is supplied to the recess 25 via the piping L, vacuum suction is performed. During vacuum suction, a force is exerted to hold the workpiece W against the suction face 28, which is the front surface of the work stage 20, and the periphery of the back surface of the workpiece W is pressed against the sealing section 30. As a result, the sealing section 30 is compressed and deformed by the force from the workpiece W in the direction of compression. Accordingly, the sealing section 30 is deformed to conform to the shape of the peripheral area of the back surface of the workpiece W, thereby preventing vacuum leakage, etc. This allows the workpiece W to be pressed against the suction face 28 with sufficient force, ensuring that the workpiece W is firmly held on the suction face 28 (suction area 22). With this process, the workpiece W is pressed against the surface of the suction plate 24 in the center area and the peripheral area in sequence.

When the sealing section 30 is compressed and deformed in the thickness direction, it is conceivable that the sealing section 30 may bulge in the lateral direction orthogonal to the thickness direction. In this case, in the portion where the two sides 32 intersect, in other words, in the corner 33 of the sealing section 30, the extension of the two sides 32 in the lateral direction is concentrated, and the corner 33 may bulge due to the extension that has lost its escape route. It can be said that the deformation in the lateral direction concentrated in the corner 33 from the respective sides 32 is converted into a repulsive force. As a result of this, a large repulsive force locally acts in the four corners of the workpiece W compared with other locations, possibly resulting in decreasing the flatness of the workpiece W. (see FIG. 10).

As mentioned above, in the example shown in FIG. 4, the cutouts 41 are provided in the four corners (four corners 33) of the sealing section 30 to suppress the repulsive force. The cutouts 41 also provide a structure in which bulges from the adjacent sides 32 in the lateral direction can be escaped, for example. This allows the workpiece W to be pressed against the front surface of the suction plate 24 with sufficient force without being bulged, enabling the workpiece W to be held with high flatness on the work stage 20. As a result, the exposure apparatus 100 can appropriately suppress exposure defects due to defocus and can sufficiently avoid degradation in the yield rate.

Configuration Example of
Repulsive-Force-Suppressing Section

Figure 6A:
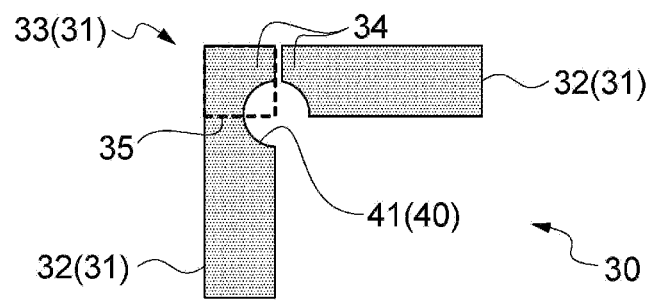
FIG. 6A is a schematic view illustrating a configuration example of a repulsive-force-suppressing section.
Figure 6B:
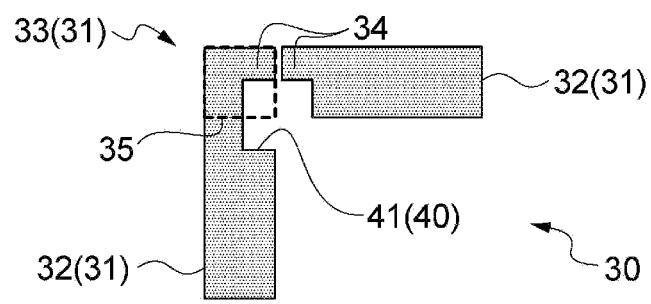
FIG. 6B is a schematic view illustrating another configuration example of a repulsive-force-suppressing section.
Figure 6C:
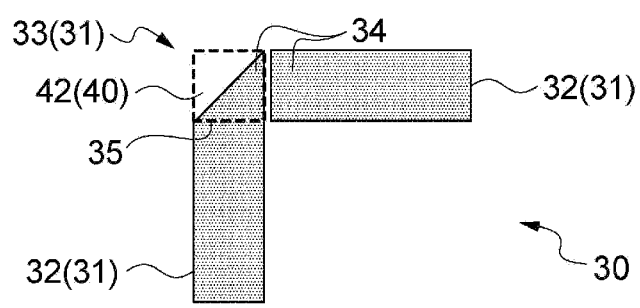
FIG. 6C is a schematic view illustrating yet another configuration example of a repulsive-force-suppressing section.
Figure 6D:
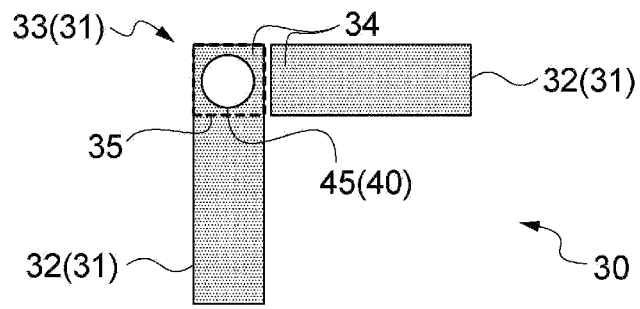
FIG. 6D is a schematic view illustrating yet another configuration example of a repulsive-force-suppressing section.
Figure 6E:
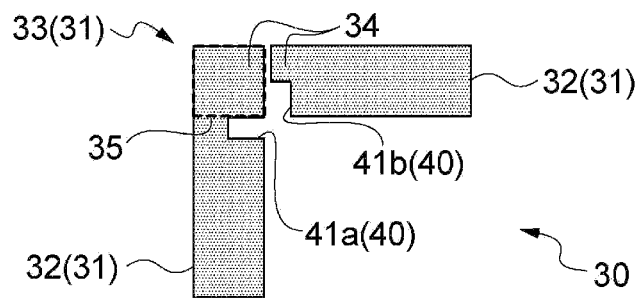
FIG. 6E is a schematic view illustrating yet another configuration example of a repulsive-force-suppressing section.

FIGS. 6A to 6E each are a schematic view illustrating a configuration example of the repulsive-force-suppressing section 40. FIGS. 6A through 6D each schematically illustrate a configuration example in which the area of the mounting face 34 in the corner 33 is smaller than the intersection area 35. FIG. 6E schematically illustrates a configuration example in which the area of the mounting face 34 around the corner 33 is made smaller. Here, the repulsive-force-suppressing section 40 provided in the one corner 33 is represented among the plurality of corners 33 included in the sealing section 30.

In FIG. 6A, the cutout 41 is provided inside the corner 33 as the repulsive-force-suppressing section 40. The planar shape of the cutout 41 is circular. This is a similar configuration as the cutout 41 shown in FIG. 4. The circular cutout 41 makes it possible to disperse the concentration of stress in the lateral direction, for example, sufficiently suppressing the bulge in the corner 33.

In FIG. 6B, the cutout 41 is provided inside the corner 33 as a repulsive-force-suppressing section 40. The planar shape of the cutout 41 is a square. The square cutout 41 can be easily formed, for example, by cutting the elastic member that constitutes the sealing section 30 in a linear fashion. This improves the manufacturability of the sealing section 30 and reduces manufacturing costs.

In FIG. 6C, an outer-periphery-cut section 42 in which the outer periphery of the corner 33 is cut is provided as the repulsive-force-suppressing section 40. In the outer-periphery-cut section 42 shown in FIG. 6C, an area is cut, including the outer side vertex, along the diagonal line between the inner side vertex and the outer side vertex in the intersection area 35. This makes the area of the mounting face 34 in the corner 33 smaller than the intersection area 35. In this way, even when the outer side of the corner 33 is cut, the surface that is in contact with the workpiece W during compression is reduced, thereby enabling the reduction of the repulsive force in the corners 33.

In FIG. 6D, an opening 45 overlapping the corner 33 (intersection area 35) is provided as the repulsive-force-suppressing section 40. The opening 45 is a through-hole with a closed outer periphery. In FIG. 6D, the circular opening 45 is provided inside the intersection area 35. This makes the area of the mounting face 34 in the corner 33 smaller than the intersection area 35. In this way, even when a through-hole is provided inside the corner 33, it is possible to reduce the repulsive force in the corner 33.

Accordingly, in FIGS. 6A, 6B, 6C, and 6D, the repulsive-force-suppressing section 40 is disposed to overlap the intersection area 35. This makes it possible to directly reduce the repulsive force in the corner 33, sufficiently suppressing the bulge of the workpiece W. Therefore it becomes possible to sufficiently improve the flatness of the workpiece W.

In FIG. 6E, cutouts 41 each are provided inside the side 32 connecting to the corner 33 as the repulsive-force-suppressing section 40. Specifically, cutouts 41a and 41b are formed from inside the two sides 32 connecting to the corner 33 and are in contact with the intersection area 35. In this way, the repulsive-force-suppressing section 40 may be disposed to be in contact with the intersection area 35. Even this configuration makes it possible to suppress the bulge concentrated in the corner 33 in the lateral direction and reduce the repulsive force in the corner 33.

Figure 7A:
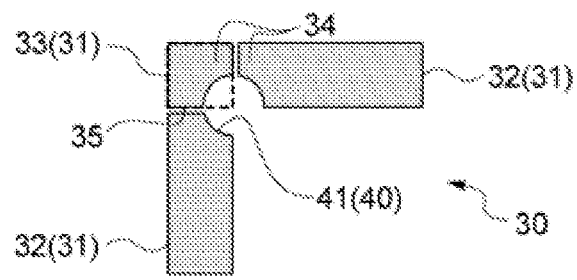
FIG. 7A is a schematic view illustrating yet another configuration example of a repulsive-force-suppressing section.
Figure 7B:
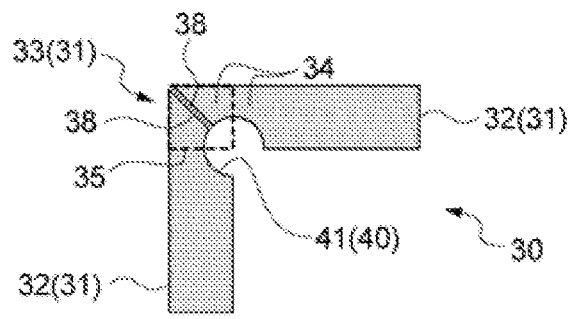
FIG. 7B is a schematic view illustrating yet another configuration example of a repulsive-force-suppressing section.

FIGS. 7A and 7B each are a schematic view illustrating another configuration example of the sealing section 30. In the sealing section 30 described above, the corner 33 was formed by one of the members constituting the two adjacent sides 32. In FIG. 7A and FIG. 7B, the way in which the members constituting each part of the sealing section 30 (the two sides 32 and corner 33) are arranged is different from that in the configuration examples described above.

In FIG. 7A, the two sides 32 and the corner 33 each are composed of an individual member. Here, two members, each of which serves as the side 32, are arranged adjacent to a member that serves as the corner 33. The angle between the sides 32 is set at 90 degrees. In FIG. 7A, the circular cutout 41 is formed overlapping the three members (the two sides 32 and the corner 33) as the repulsive-force-suppressing section 40. It can be said that this is a configuration example in which the corner 33 of the sealing section 30 shown in FIG. 6A is configured with a member other than the side 32.

The center of the circular cutout 41 is set, for example, on a line connecting the outer side vertex (upper left vertex in the figure) and the inner side vertex (lower right vertex in the figure) of the intersection area 35. In this case, the two sides 32 cut by the circular cutout 41 have a shape in line symmetry with each other. When the two sides 32 have a shape in line symmetry, it is possible to use one side 32 as the other side 32 by reversing the upper face and lower face of the other side 32 (or the top and bottom or the left and right arrangement of the sides 32). In other words, it is possible to make the member constituting the sides 32 common. In addition, the corner 33 can be used at any vertex, thus the member constituting the corner 33 can also be made common. Therefore, making the members constituting the corner 33 and the side 32 common enables the reduction of manufacturing costs.

In FIG. 7B, the corner 33 is formed by two members constituting the two adjacent sides 32. The two members forming the sides 32 each have a planar shape of an elongated rectangle with an inclined oblique side 38 at a predetermined angle with respect to the longitudinal direction at the end of the rectangle. For example, as shown in FIG. 7B, when the angle between the two sides 32 is set at 90 degrees, the end of each member has an oblique side 38 inclined at a 45 degree with respect to the longitudinal direction. The two members that serve as the sides 32 are disposed with the respective oblique sides 38 facing each other in a manner that the vertices of the acute angle formed by the oblique sides 38 face each other. The intersection area 35 is formed in an area including the two oblique sides 38. Of the two members serving as the sides 32, the portion overlapping with the intersection area 35 becomes the corner 33.

In FIG. 7B, the circular cutout 41 is formed as the repulsive-force-suppressing section 40, so as to overlap the two members constituting the two sides 32 and the corners 33. It can be said that it is a configuration example in which the corner 33 is formed by the two members constituting the two sides 32 in the sealing section 30 shown in FIG. 6A. In this case, as in FIG. 7A, by setting the center of the circular cutout 41 on the line connecting an outer side vertex and an inner side vertex in the intersection area 35, the two members have a shape in line symmetry with each other. Therefore, this can make the two members constituting the side 32 and the corner 33 common and reduce the number of parts.

FIGS. 7A and 7B describe an example in which the circular cutout 41 is provided as the repulsive-force-suppressing section 40, but it is not limited to this. For example, instead of the circular cutout 41, as in FIG. 6B, the square cutout 41 may be provided. As in FIG. 6C, the outer-periphery-cut section 42 in which the outer periphery of the corner 33 is cut out may also be provided. As in FIG. 6D, the opening 45 overlapping the corner 33 may be also provided. As in FIG. 6E, the cutout 41 may also be provided inside the side 32 connecting to corner 33. In either case, forming the side 32 with the planar shape in line symmetry enables the two members to be made common.

FIGS. 8A to 8D each are a schematic view illustrating another configuration example of the repulsive-force-suppressing section. In FIGS. 8A to 8D, used is a step section 43 in which at least a part of the front surface of the corner 33 is lowered with respect to the mounting face 34, as the repulsive-force-suppressing section 40. The step section 43 is a step in which all or a part of the upper side surface of the corner 33 is recessed with respect to other parts.

Figure 8A:
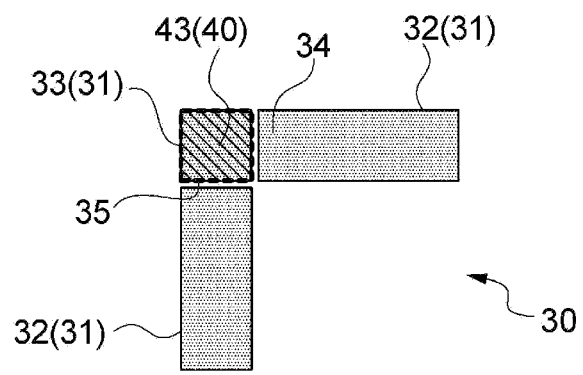
FIG. 8A is a schematic view illustrating yet another configuration example of a repulsive-force-suppressing section.
Figure 8B:
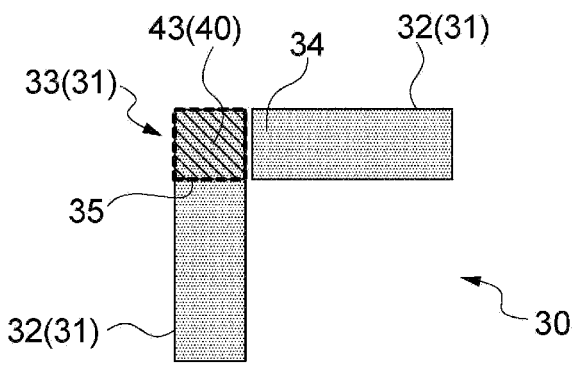
FIG. 8B is a schematic view illustrating yet another configuration example of a repulsive-force-suppressing section.
Figure 8C:
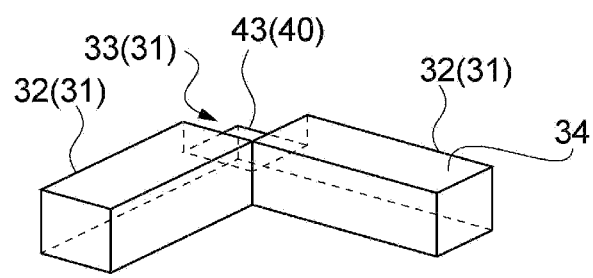
FIG. 8C is a perspective view schematically illustrating the repulsive-force-suppressing section in FIGS. 8A and 8B.

FIGS. 8A and 8B each schematically illustrate a plan view of the step section 43 formed over the entire intersection area 35. The shaded area in the figure is the step section 43, and the step section 43 is set to the same size as the intersection area 35. FIG. 8C also schematically illustrates a perspective view of the step section 43 shown in FIG. 8A and FIG. 8B. As shown in FIG. 8C, the portion for the step section 43 is an area recessed by a predetermined depth with respect to the mounting face 34 formed by the adjacent sides 32.

In FIG. 8A, the two sides 32 and the corner 33 each are composed of individual members. In this case, the thickness of the member constituting the corner 33 is set smaller than that of the member constituting the sides 32. As a result, the upper side surface of the corner 33 is configured to be a step section 43 that is lower than the upper side surface (mounting face 34) of the sides 32. For example, if the corner 33 is formed in a part of the side 32, it is necessary to perform a process in which the thickness of the side 32 is partially made smaller. In contrast, configuring the corner 33 as a member separate from the side 32 eliminates a need for a process in which the corner 33 is provided with the side 32 and the like, resulting in easily manufacturing the members that will become the corner 33 and the side 32.

In FIG. 8B, the corner 33 is formed on one of the members constituting the two sides 32. In this case, the thickness of the portion that becomes the corner 33 is set smaller than the thickness of the other portion. As a result, the step section 43 that is lower than the mounting face 34 is configured in the portion that becomes the corner 33. In this way, the side 32 and the corner 33 may be formed integrally. This makes it possible to reduce the number of members.

The thickness of the step section 43 in its natural state is set to be smaller than the thickness of the position (side 32) that becomes the mounting face 34 and larger than the thickness of the sealing section 30 (thickness of the suction plate 24 in the present embodiment) in a state in which the sealing section 30 is compressed and deformed during vacuum suction. In this case, since the thickness of the step section 43 is smaller than the position that becomes the mounting face 34, the repulsive force is made smaller. This makes it possible to directly reduce the repulsive force in the corner 33, sufficiently suppressing the bulge of the workpiece W. In the case in which the sealing section 30 is compressed and deformed, the step section 43 is also compressed to some extent to adhere to the workpiece W, thereby making it possible to suppress the occurrence of vacuum leakage.

Figure 8D:
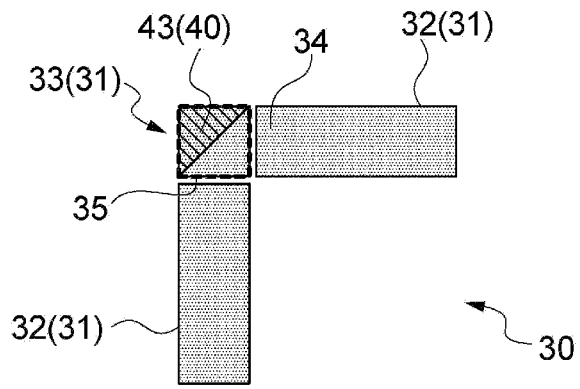
FIG. 8D is a schematic view illustrating yet another configuration example of a repulsive-force-suppressing section.

FIG. 8D schematically illustrates a plan view of an example of the step section 43 formed in a part of the intersection area 35. The shaded area shown in FIG. 8D is the step section 43. Here, the step section 43 is formed in an area, of the intersection area 35 overlapping the corner 33, including the outer side vertex and a diagonal line that separates the inner side vertex and the outer side vertex. Note that the area including the inner side vertex is set to the same thickness as the sides 32 and serves as the mounting face 34. In FIG. 8D, the corner 33 and the side 32 are configured to be individual members; however, the corner 33 may be integrally configured with the side 32.

Accordingly, even in a configuration in which only a part of the intersection area 35 serves as the step section 43, it is possible to reduce the repulsive force generated in the corner 33, thereby capable of suppressing the bulge of the workpiece W. In addition, the corner 33 is formed with the mounting face 34 in addition to the step section 43. Hence, the corner 33 securely adheres to the workpiece W, capable of sufficiently suppressing the occurrence of vacuum leakage.

Figure 9A:
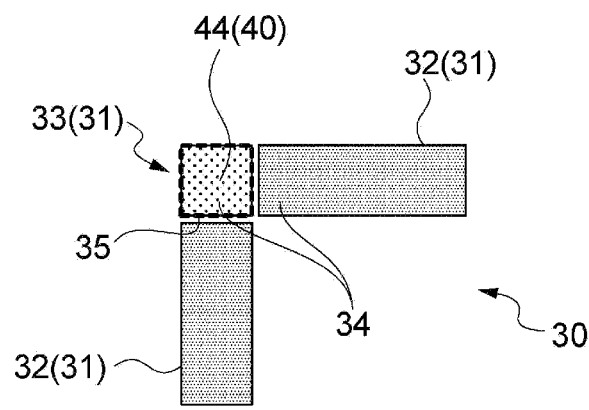
FIG. 9A is a schematic view illustrating yet another configuration example of a repulsive-force-suppressing section.
Figure 9B:
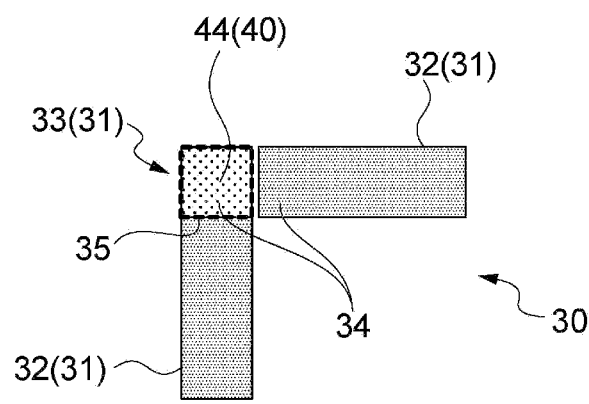
FIG. 9B is a schematic view illustrating yet another configuration example of a repulsive-force-suppressing section.

FIGS. 9A and 9B each are a schematic view illustrating another configuration example of the repulsive-force-suppressing section. In FIGS. 9A and 9B, as the repulsive-force-suppressing section 40, used is a low-repulsion section 44 disposed in the corner 33 and made of an elastic material having lower repulsion than that of the side 32. The low-repulsion section 44 is made of an elastic material having lower repulsion than an elastic material constituting the side 32. Examples of the low-repulsion section 44 include a rubber sponge with more pores and a lower repulsive force than the material used for the side 32.

In FIG. 9A, the two sides 32 and the corner 33 each are configured as an individual member, and the sealing section 30 is configured by attaching each member separately. A material having lower repulsion than that of the side 32 is used for the member constituting the corner 33, and the entire corner section 33 serves as the low-repulsion section 44. In this case, it is possible to easily manufacture the members that will serve as the corner 33 and the side 32 by processing materials with different repulsive forces. In FIG. 9B, the corner 33 is integrally formed with the member constituting one of the two sides 32. For example, the low-repulsion section 44 is formed by bonding a member having lower repulsion to the portion that becomes the corner 33 in the member constituting the side 32. In this case, the number of members that need to be attached can be reduced.

For example, the thickness of the low-repulsion section 44 (corner 33) is set equal to the thickness of the side 32. In this case, the upper side surface of the low-repulsion section 44 functions as the mounting face 34 together with the upper side surface of the side 32. In a state in which the workpiece W is placed and is subjected to vacuum suction, the low-repulsion section 44 (corner 33) and the side 32 are compressed and deformed by the same amount of displacement. At this time, the repulsive force in the low-repulsion section 44 (corner section 33) is lower than that in the side 32, making it possible to suppress the corners of the workpiece W from bulging.

The position and shape of the low-repulsion section 44 are not limiting. For example, in addition to the corner 33, the low-repulsion section 44 may be provided in the two sides 32 that are in contact with the corner 33. In addition, the low-repulsion section 44 may be provided in at least one of the corners 33. Even in this case, the repulsive force in the corner 33 is suppressed and the bulge of the workpiece W can be suppressed.

As described with reference to FIGS. 6 to 9, in the present embodiment, the repulsive-force-suppressing section 40 such as the cutout 41, the step section 43, and the low-repulsion section 44 is provided in the corner 33 formed in the sealing section 30. By configuring the workpiece W to be subjected to vacuum suction and to be held by the sealing section 30, it is possible to suppress the four corners of the workpiece W from bulging when the workpiece W is subjected to vacuum suction. Therefore, it is possible to hold the workpiece W appropriately flat.

As described above, in the work stage 20 according to the present embodiment, the sealing section 30 including the elastic section 31 is disposed to surround the suction area 22 on which the workpiece W is subjected to vacuum suction. The repulsive-force-suppressing section 40 is provided in the corner 33 configuring the sealing section 30. As a result, the repulsive force in the corner 33 is suppressed and the bulge of the workpiece W can be reduced. Therefore, it is possible to achieve vacuum suction with high flatness.

Figure 10:
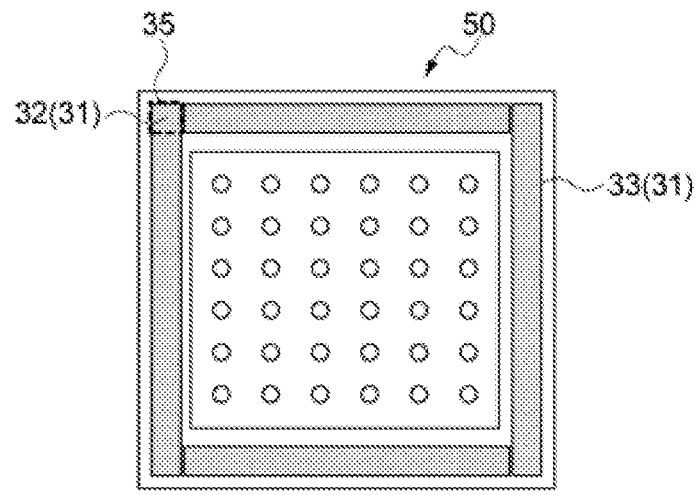
FIG. 10 is a schematic view illustrating a sealing section as a comparative example.

FIG. 10 is a schematic view illustrating a sealing section 50 as a comparative example. The corner 33 provided in the sealing section 50 shown in FIG. 10 is made of the similar material as that of the side 32, and has the similar thickness as that of the side 32. Each side of the corner 33 is set to be similar to the width of the side 32. In other words, the corner 33 is configured in the entire intersection area 35 of the two sides 32 and made of the similar material as that of the side 32. In this case, when the sealing section 30 is compressed and deformed in the thickness direction, the extension of the two sides 32 in the lateral direction may concentrate on the corner 33, causing the corner 33 to bulge.

It is required that the work stage 20 securely suction and hold the workpiece W placed thereon, and the workpiece W is made flat during suction and holding. However, in the example shown in FIG. 10, the four corners of the workpiece W that is subjected to vacuum suction are bulged, and the flatness of the workpiece W may be degraded. In recent years, the patterns exposed onto the workpiece W have become finer as wiring becomes miniaturized and mounting density is increased. Accordingly, even if the workpiece W bulges slightly, for example, defocus occurs in and around the bulged area during processing such as exposure, resulting in exposure failure. As a result, there was a problem with lowering the yield rate.

In the present embodiment, the repulsive-force-suppressing section 40 is provided in the corner 33 in which a bulge is likely to occur in the sealing section 30. The cutout 41, the step section 43, and the low-repulsion section 44 provided in the four corners, for example, serve as the repulsive-force-suppressing sections 40. These repulsive-force-suppressing sections 40 suppress the repulsive force acting on the workpiece W from the corners 33.

Accordingly, introducing the sealing section 30 provided with the repulsive-force-suppressing section 40 enables the work stage 20, which holds the workpiece W with vacuum suction, to suppress the four corners from bulging and hold the workpiece W with good flatness when the workpiece W is subjected to vacuum suction in the work stage 20. Therefore, exposure defects caused by defocus or the like can be sufficiently suppressed and the yield rate can be improved.

Examples of the workpiece W held by suction on the work stage 20 and processed include a printed circuit board. Printed circuit boards are manufactured by forming patterns such as circuits on substrates made of resins such as glass epoxy. In recent years, the fields in which printed circuit boards are applied have expanded, and various types of boards have come to be used, including boards that are soft and easily deformable, and boards having a large number of cutouts and through-holes in complex shapes. In addition, printed circuit boards have become larger over the years, making them more prone to warping and deformation.

The work stage 20 according to the present invention, even if the workpiece W is prone to warp or deform significantly, is capable of suppressing the four corners of the workpiece W from bulging and holding the workpiece W appropriately flat. The exposure apparatus including the work stage 20 is capable of achieving high-precision exposure. It is also capable of improving the yield rate because exposure defects are suppressed.

Second Embodiment

The work stage according to the second embodiment of the present invention will be described. In the following, the description will be omitted or simplified for the parts similar to the configuration and action of the work stage 20 described in the above embodiment.

Figure 11A:
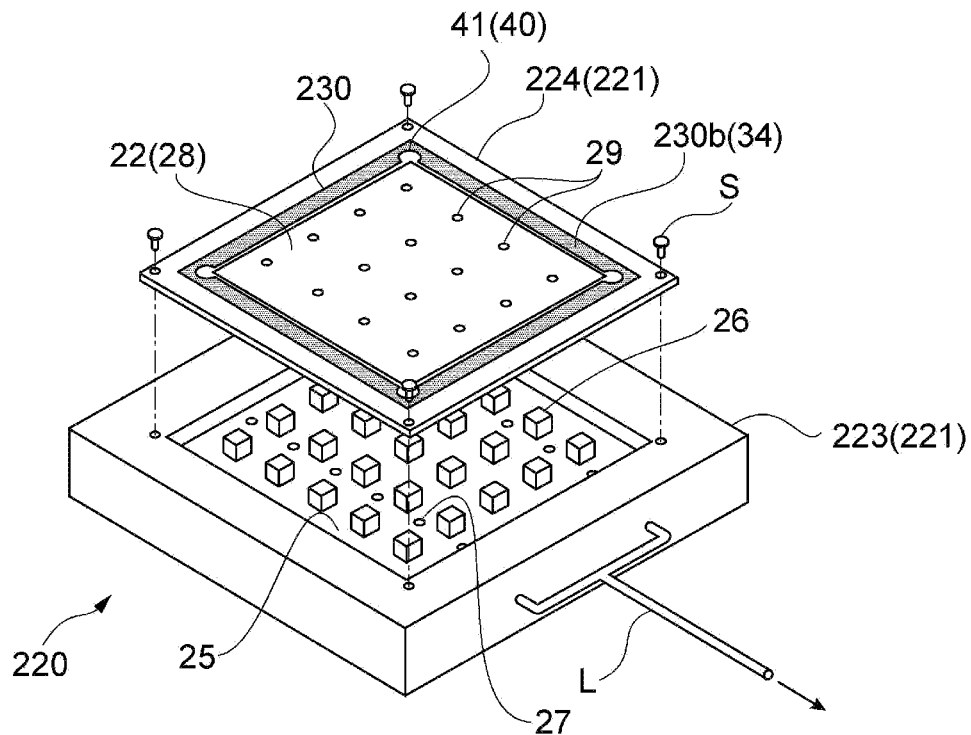
FIG. 11A is a perspective view schematically illustrating a configuration example of a work stage according to a second embodiment.
Figure 11B:
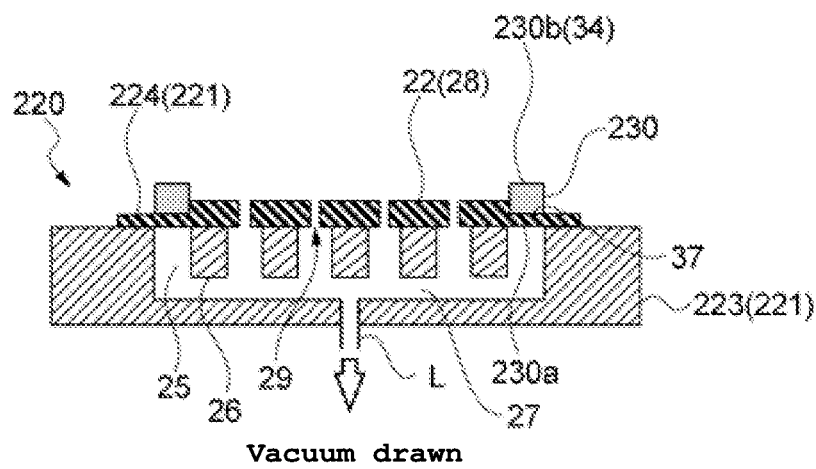
FIG. 11B is a cross-sectional view schematically illustrating a configuration example of the work stage according to the second embodiment.

FIGS. 11A and 11B each are a schematic view illustrating a configuration example of a work stage according to the second embodiment. FIG. 11A is a perspective view schematically illustrating a state in which the work stage 220 is disassembled. FIG. 11B is a cross-sectional view schematically illustrating a configuration example of the work stage 220. As shown in FIGS. 11A and 11B, the work stage 220 includes a suction section 221 composed of a base 223 and a suction plate 224, and a sealing section 230. Of these, the base 223 is configured in the same manner as the base 23 described with reference to FIG. 2, for example.

As shown in FIG. 11A, in the work stage 220, the sealing section 230 is attached to the suction plate 224. Here, the sealing section 230 is disposed on the upper side of the rectangle-shaped suction plate 224 that entirely covers the recess 25 of the base 223, so as to surround the suction face 28 (suction area 22). The four corners 33 of the sealing section 230 are each provided with the repulsive-force-suppressing section 40 (here, the circular cutout 41). This makes it possible to suppress the four corners from bulging.

Also, the mounting section 37 to which a lower face 230$a$ of the sealing section 230 is attached is provided in the surroundings of the suction area 22. The mounting section 37 is configured as a step that is lower than the suction face 28, and the lower surface 230a of the sealing section 230 is attached to a position lower than the suction face 28. The sealing section 30 is configured such that an upper face 230b protrudes higher than the suction face 28 with the lower face 230a attached to the mounting section 37. This configuration allows the upper face 230b of the sealing section 230 to become substantially flush with suction face 28 during compression, enabling the workpiece W to be subjected to vacuum suction properly.

This configuration in which the sealing section 230 is provided in the suction plate 224 broadens the size of the workpiece W that can be handled. For example, the shape of the suction area 22 and the sealing section 230 is configured to match the shape of the workpiece W to be mounted on the work stage 220. This enables the workpiece W to be subjected to vacuum suction properly with a high degree of flatness, even if the workpiece W is smaller than the planar shape of the recess 25 of the base 223, for example.

Other Embodiments

The present embodiment is not limited to the embodiments described above; however, various other embodiments can be achieved.

In the above embodiments, described is a work stage configured to fix a suction plate to a base with screws. (see FIGS. 2 and 11). The method of fixing the suction plate is not limited to this; for example, the method of fixing the suction plate using vacuum suction may also be used.

Figure 12A:
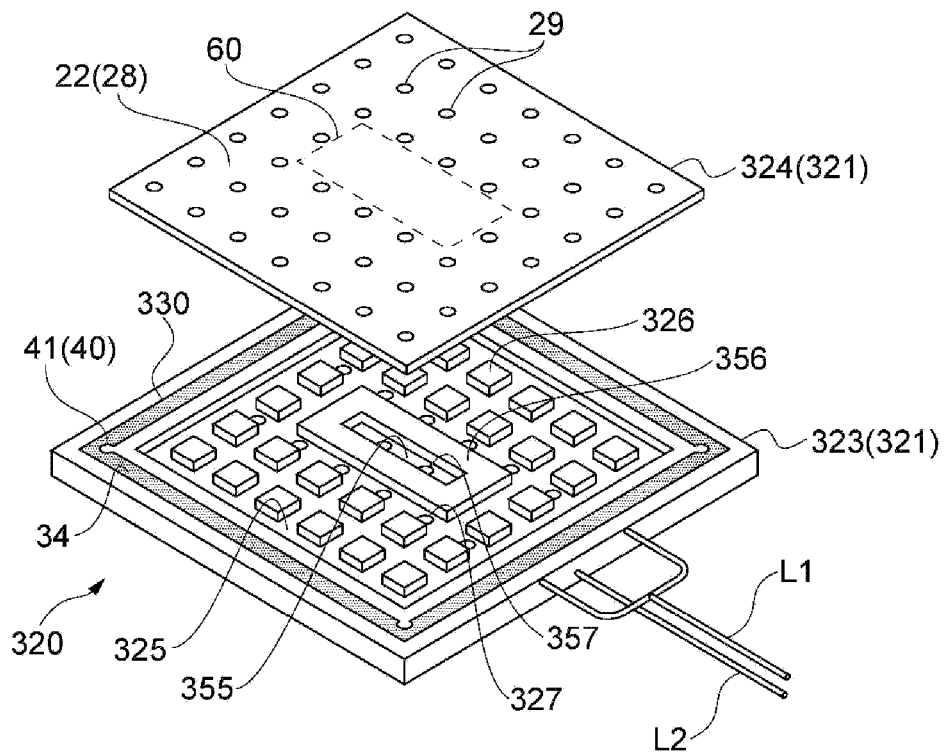
FIG. 12A is a perspective view schematically illustrating a configuration example of a work stage according to another embodiment.

FIG. 12A is a schematic view illustrating a configuration example of a work stage according to another embodiment. A work stage 320 includes a suction section 321 composed of a base 323 and a suction plate 324, and a sealing section 330. Of these, the configuration of the base 323 and suction plate 324 mainly differs from that in the work stage described above. In FIG. 12A, the sealing section 330 is attached to the base 323 so as to surround the suction plate 324.

The base 323 includes a first recess 325, a first protrusion 326, first vacuum introduction channels 327, a second recess 355, a second protrusion 356, and second vacuum introduction channels 357. The first recess 325 is formed in the center portion of the upper side surface of the base 323, and the plurality of first protrusions 326 and second protrusions 356 are formed in the first recess 325. The suction plate 324 is mounted on the plurality of first protrusions 326 and second protrusions 356. The second protrusion 356 is an annular protruding portion provided in the center portion of the first recess 325, and the second recess 355 is formed inside the second protrusion 356.

The plurality of first vacuum introduction channels 327 is provided in the first recess 325. Each of the first vacuum introduction channels 327 is connected to a first vacuum system (piping L1) attached to the base 323. The vacuum or air supplied to the piping L1 is introduced from the first vacuum introduction channels 327 to the first recess 325. The plurality of second vacuum introduction channels 357 is provided in the second recess 355. Each of the second vacuum introduction channels 357 is connected to a second vacuum system (piping L2) attached to the base 323. The vacuum or air supplied to the piping L2 is introduced from the second vacuum introduction channels 357 to the second recess 355. The introduction of vacuum or air to the piping L1 (first vacuum system) and the piping L2 (second vacuum system) can be independently controlled.

The upper side surface of the base 323 is finished with an accurate flat surface. Here, the upper side surface is a surface formed with the upper face of the first protrusion 326, the upper side of the second protrusion 356, and the upper outer-periphery face of the base 323 (the face surrounding the edge of the first recess 325). That is, the upper face of the first protrusion 326, the upper face of the second protrusion 356, and the outer-periphery face of the base 323 are at the same height.

The first recess 325, the first protrusion 326, and the first vacuum introduction channels 327 correspond to, for example, the recess 25, the protrusion 26, and the vacuum introduction channels 27 shown in FIG. 2. Hence, it can be said that the base 323 is configured to be the base 23, which is shown in FIG. 2, provided with the second recess 355, the second protrusion 356, and the second vacuum introduction channels 357, and connected to the piping L2, which is the second vacuum system.

The suction plate 324 is a thin plate member that entirely covers the first recess 325 of the base 323. The suction plate 324 has the suction face 28 and the plurality of vacuum suction holes 29. The suction face 28 forms the suction area 22 and is a face on which the workpiece W is held during vacuum suction. The plurality of vacuum suction holes 29 is through-holes formed on the suction face 28. Every vacuum suction hole 29 is provided over the entire area overlapping the first recess 325, excluding a fixed area 60 (dotted-line area in the figure) overlapping the second protrusion 356, in the plan view from the upper side. It is noted that the fixed area 60 is provided with no through-hole, and completely covers the second protrusion 356 (second recess 355).

The operation of the work stage 320 will now be described. In the work stage 320, the suction plate 324 is mounted on the upper side surface of the base 323 with the piping L1 and L2 closed and no vacuum or air supply. The suction plate 324 is mounted such that the fixed area 60 and the second protrusion section 356 overlap each other. With the suction plate 324 mounted, the vacuum is supplied to the piping L2. As a result, vacuum is introduced into the second recess 355 via the second vacuum introduction channels 357, and the suction plate 324 is subjected to vacuum suction. Accordingly, the suction plate 324 can be fixed to the base 323.

With the suction plate 324 fixed, the workpiece W is placed on the suction plate 324 (suction face 28). At this time, the workpiece W is supported by the mounting face 34 of the sealing section 330 with floating off the suction face 28. Accordingly, with the workpiece W placed on the mounting face 28, vacuum is supplied to the piping L1. As a result, vacuum is introduced into the first recess 325 via the first vacuum introduction channels 327, and the workpiece W is subjected to vacuum suction on the suction face 28 via the vacuum suction holes 29. This enables the workpiece W to be fixed to the suction plate 324. When processing such as exposure to the workpiece W is completed, air is supplied to the piping L1, releasing the vacuum suction of the workpiece W.

During the period of performing vacuum suction of the workpiece W and even the period of releasing the vacuum suction of the workpiece W, the vacuum is drawn via the piping L2 and the suction plate 324 is continuously fixed to the base 323. In the case of replacing the suction plate 324, the vacuum drawn via the piping L2 is stopped, and air, etc. is supplied from the piping L2. This allows the suction plate 324 to be easily removed. Since there are no through-hole or the like in the fixed area 60 of the suction plate 324, the workpiece W is not subjected to vacuum suction via the piping L2. In other words, the vacuum suction of the suction plate 324 and the vacuum suction of the workpiece W can be performed completely independently.

Figure 12B:
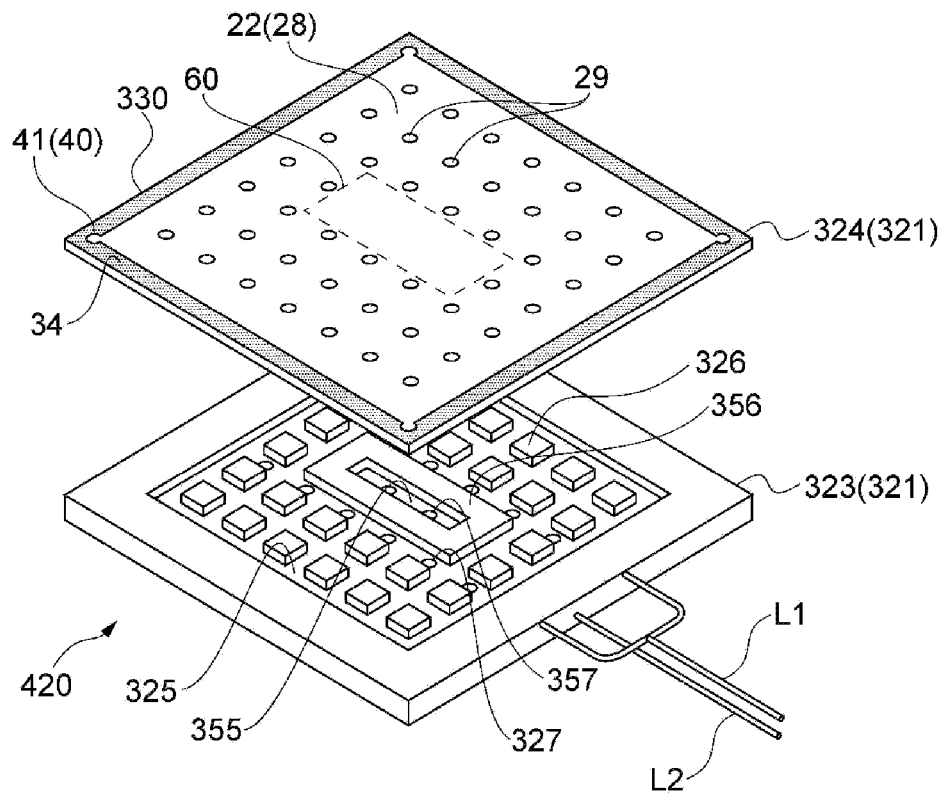
FIG. 12B is a perspective view schematically illustrating a configuration example of a work stage according to yet another embodiment.

FIG. 12B is a schematic view illustrating a configuration example of a work stage according to another embodiment, in which the arrangement of the sealing section 330 in FIG. 12A is modified. In a work stage 420 shown in FIG. 12B, the sealing section 330 is attached to the suction plate 324 so as to surround the suction face 28. Even with this configuration in which the sealing section 330 is attached to the suction plate 324, the vacuum suction of the suction plate 324 and the vacuum suction of the workpiece W can be performed completely independently.

In the work stage 420, the planar shape of the suction plate 324 is set to the same shape and size as the planar shape of the outer-periphery portion of the base 323 when viewed from the upper side, for example. This enables a larger workpiece W to be subjected to vacuum suction than that in the case where the sealing section 330 is mounted on the base 323.

In this way, in the work stage 320 and 420, the suction plate 324 is subjected to vacuum suction to the base 323 from the back surface thereof. This enables even the end of the outer-periphery portion of the suction plate 324 (or base 323) to be used as the suction face 28, without being interfered with the screw fixings or the like. In addition, in the case of replacing the suction plate 324, the work such as fixing screws becomes unnecessary, thereby easily performing the replacement work of the suction plate 324 or the like even in a small space.

The above describes a configuration in which the repulsive-force-suppressing sections 40 are provided in all four corners in a sealing section having a rectangular planar shape. However, it is not necessary to provide the repulsive-force-suppressing sections 40 in all of the four corners 33; for example, at least one of the four corners 33 may be provided with the repulsive-force-suppressing section 40 depending on the material and thickness of the workpiece W or the like. This configuration is also capable of suppressing the workpiece W from bulging in the corner 33 provided with the repulsive-force-suppressing section 40.

The repulsive-force-suppressing section 40 with different characteristics and types may be provided in each corner 33. For example, each corner 33 is provided with, for example, the cutout 41 having a different size and shape, as the repulsive-force-suppressing section 40. Moreover, for example, different types of the repulsive-force-suppressing sections 40, such as the cutouts 41, the step sections 43, and the low-repulsion sections 44 may be provided in a mixed manner. In addition, the selections of the corners 33 provided with the repulsive-force-suppressing sections 40, the characteristics and types of the repulsive-force-suppressing sections 40 provided in the respective corners 33, and the like are not limiting and may be set appropriately according to the type of the workpiece W, required flatness, and the like.

Figure 13:
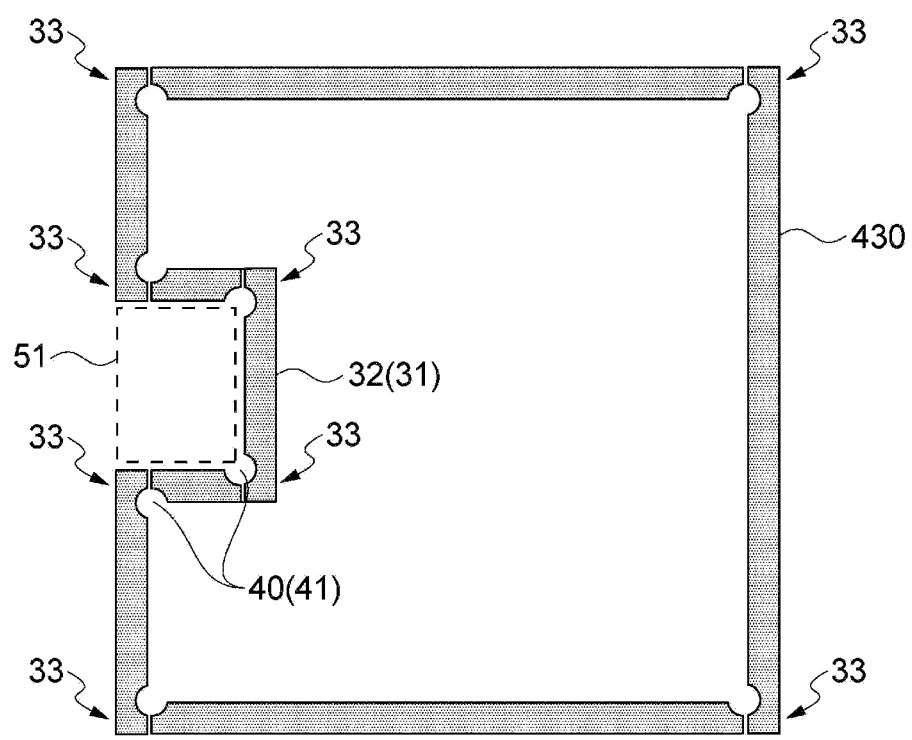
FIG. 13 is a schematic view illustrating a configuration example of a sealing section according to another embodiment.

FIG. 13 is a schematic view illustrating a configuration example of a sealing section according to another embodiment. The above mainly describes a sealing section having a rectangular planar shape; however, the shape of the sealing section is not limited to this.

FIG. 13 schematically illustrates a deformed polygon-shaped sealing section 430, in which a concave-shaped area 51 (dotted-line area in the figure) is inwardly formed on one side of the rectangle-shaped area. Here, the concave-shaped area 51 is configured as a rectangle-shaped area bounded by the four corners 33. In this case, the sealing section 430 has the eight corners 33 in total, including the corners 33 formed in areas other than the concave-shaped area 51.

Even in such a case, providing the repulsive-force-suppressing section 40 (in this case, the circular cutout 41) in each corner 33 is capable of suppressing the repulsive force in the corner 33 and the bulge of the workpiece W. This enables the workpiece W even having a complex shape with a cutout in its outer periphery to be subjected to vacuum suction properly with high flatness.

The workpiece W may be disposed to cover the concave-shaped area 51. In this case, the concave-shaped area 51 can be used as a space for a jig or the like to sandwich the workpiece W when transporting the workpiece W. Thus, even in the case where the shape of the sealing section 430 is deformed to introduce a transport system or the like, providing the repulsive-force-suppressing section 40 is capable of sufficiently suppressing the workpiece W from bulging in the deformed portion (concave-shaped area 51).

In addition, the shape of the sealing section is not limiting. The present invention can be applied to any shape as long as it is a shape in which corners are formed. For example, the angle of the corner (intersection angle of the sides) need not be 90 degrees; however, a rhombus or parallelogram sealing section may be configured. Furthermore, a polygon-shaped sealing section having a triangular or pentagonal shape, for example, may also be configured. The shape of the sides is also not limiting; a part of the sides may be curved, for example.

In the repulsive-force-suppressing section described with reference to FIG. 6, etc., described is a configuration of reducing the mounting face (contact area with the workpiece) in the corner by mainly forming a cutout or a step in the corner. However, the invention is not limited to this; for example, a slope or groove may be formed on the upper side surface of the corner so as to reduce the mounting face in the corner. The repulsive force in the corner may also be reduced by forming a cavity or incision inside the material constituting the corner while leaving the mounting face of the corner intact. In addition, any structure that can reduce the repulsive force in the corner may be used as the repulsive-force-suppressing section.

In the above embodiments, a work stage (holding mechanism) mainly used in exposure apparatuses is described as an example. However, the work stage (holding mechanism) according to the present invention can be used for any devices other than exposure apparatuses, as long as the devices hold a substrate with vacuum suction for processing. For example, the present holding mechanism may be utilized in devices that perform various processing processes such as evaporation, etching, sputtering, polishing, and cutting. This enables the workpiece W to be held with a high degree of flatness, capable of performing each processing process with high precision.

In the present disclosure, words such as "about", "nearly", and "approximately" are suitably used to readily understand the explanation. On the other hand, there is no clear difference between the cases in which the words "about", "nearly", and "approximately" are used and the cases in which they are not used. In other words, in the present disclosure, concepts that define shape, size, position relationship, and state, such as "center", "middle", "uniform", "equal", "same", "orthogonal", "parallel", "symmetrical", "extending", "axial direction", "cylindrical shape", "cylindrical hollow shape", "ring shape", "annular shape", "rectangular parallelepiped shape", "disc shape", "plate shape", "circular shape", "rectangular shape", "square shape", and "block shape" are concepts including "substantially center", "substantially middle", "substantially uniform", "substantially equal", "substantially same", "substantially orthogonal", "substantially parallel", "substantially symmetrical", "substantially extending", "substantially axial direction", "substantially cylindrical shape", "substantially cylindrical hollow shape", "substantially ring shape", and "substantially annular shape", "substantially rectangular parallelepiped shape", "substantially disc shape", "substantially plate shape", "substantially circular shape", "substantially rectangular shape", "substantially square shape", and "substantially block shape". The concepts also include concepts having states in a predetermined range (e.g., ±10% range) with respect to, for example, "exactly center", "exactly middle", "exactly uniform", "exactly equal", "exactly same", "exactly orthogonal", "exactly parallel", "exactly symmetrical", "exactly extending", "exactly axial direction", "exactly cylindrical shape", "exactly cylindrical hollow shape", "exactly ring shape", "exactly annular shape", "exactly rectangular parallelepiped shape", "exactly disc shape", "exactly plate shape", "exactly circular shape", "exactly rectangular shape", "exactly square shape", and "exactly block shape" and the like. Hence, even when the words such as "about", "nearly", and "approximately" are not added, the concepts may include those that are expressed by adding "about", "nearly", "approximately", and the like. Conversely, states expressed by adding "about", "nearly", "approximately", and the like do not necessarily exclude their exact states.

In the present disclosure, expressions using the term "than" such as "greater than A" and "less than A" are expressions that comprehensively include concepts that include the case that is equal to A and concepts that do not include the case that is equal to A. For example, "greater than A" is not limited to the case where it does not include "equal to A"; however, it also includes "equal to or greater than A". Also, "less than A" is not limited to "less than A"; it also includes "equal to or less than A". Upon the implementation of the present technology, specific settings and other settings are suitably adopted from the concepts that are included in "greater than A" and "less than A" to achieve the effects described above.

Among the characteristic portions according to the present technology described above, it is also possible to combine at least two of the characteristic portions. In other words, the various characteristic portions described in each embodiment may be optionally combined without being restricted to the embodiments. The various effects described above are merely examples and are not limiting; other effects may also be achieved.

What is claimed is:

1. A holding mechanism comprising:
a suction section having a suction area where a substrate is subjected to vacuum suction; and
a sealing section including an elastic section having a plurality of sides arranged to surround the suction area and a plurality of corners each formed between adjacent ones of the plurality of sides, and a repulsive-force-suppressing section provided in at least one of the plurality of corners.

2. The holding mechanism according to claim 1, wherein the elastic section has a mounting face on which the substrate is to be placed, the repulsive-force-suppressing section has a structure in which an area of the mounting face in the corner is smaller than an area of an intersection area where two sides connecting to the corner are extended and intersected.

3. The holding mechanism according to claim 2, wherein the repulsive-force-suppressing section includes a cutout formed inside the corner.

4. The holding mechanism according to claim 3, wherein the cutout has a planar shape of either a square or a circle.

5. The holding mechanism according to claim 2, wherein the repulsive-force-suppressing section includes a step section in which at least a part of a front face of the corner is lowered with respect to the mounting face.

6. The holding mechanism according to claim 1, wherein the repulsive-force-suppressing section is disposed in the corner and includes a low-repulsion section made of an elastic material having a lower repulsive force than the sides.

7. The holding mechanism according to claim 1, wherein the repulsive-force-suppressing section is disposed to overlap the intersection area where the two sides connecting to the corner are extended and intersected, or is disposed to be in contact with the intersection area.

8. The holding mechanism according to claim 1, wherein the elastic section has a planar shape of a rectangle, the plurality of corners includes four corners corresponding to four vertices of the rectangular shape, and the repulsive-force-suppressing section is provided in at least one of the four corners.

9. The holding mechanism according to claim 1, wherein the suction section includes a base having a recess from which vacuum is supplied and a plurality of protrusions formed in the recess, and a suction plate having a suction face forming the suction area and a plurality of through-holes formed in the suction face, and the suction plate being mounted on the recess; and the sealing section is attached to either the base or the suction section.

10. The holding mechanism according to claim 9, wherein the suction section includes a mounting section disposed at a lower position than the suction face and to which a lower face of the sealing section is attached, and the sealing section is configured such that an upper face thereof that is opposite to the lower face protrudes higher than the suction face in a state in which the mounting section is attached to the lower face.

11. The holding mechanism according to claim 1, wherein the elastic section is configured using a rubber sponge.

12. An exposure apparatus comprising:
a light emission section that emits exposure light;
a mask stage that holds a mask on which a pattern has been formed in an optical path of the exposure light; and
a work stage that holds a workpiece to which the pattern is to be transferred, the work stage including:
a suction section having a suction area where the workpiece is subjected to vacuum suction;
a sealing section including an elastic section having a plurality of sides arranged to surround the suction area and a plurality of corners each formed between adjacent ones of the plurality of sides, and a repulsive-force-suppressing section provided in at least one of the plurality of corners.

* * * * *